US006975131B2

(12) United States Patent
Szczypinski et al.

(10) Patent No.: US 6,975,131 B2
(45) Date of Patent: Dec. 13, 2005

(54) INTEGRATED MODULE HAVING A DELAY ELEMENT

(75) Inventors: Kazimierz Szczypinski, München (DE); Johann Pfeiffer, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 29 days.

(21) Appl. No.: 10/783,377

(22) Filed: Feb. 20, 2004

(65) Prior Publication Data

US 2004/0222811 A1 Nov. 11, 2004

(30) Foreign Application Priority Data

Feb. 21, 2003 (DE) ................................ 103 07 537

(51) Int. Cl.[7] ............................................. G01R 31/26
(52) U.S. Cl. ...................... 324/765; 324/73.1; 324/763
(58) Field of Search .............................. 324/73.1, 617, 324/763–765, 158.1; 714/700, 745, 815

(56) References Cited

U.S. PATENT DOCUMENTS 4,495,628 A * 1/1985 Zasio .......................... 377/70
5,579,326 A * 11/1996 McClure ..................... 714/814
5,796,265 A 8/1998 Sporck
6,356,096 B2 * 3/2002 Takagi et al. ............... 324/765
2002/0044053 A1 4/2002 Seki

FOREIGN PATENT DOCUMENTS

| | | |
|---|---|---|
| EP | 0 645 638 | 3/1995 |
| JP | 64 84637 | 3/1989 |
| JP | 5 74913 | 3/1993 |
| JP | 2000 91506 | 3/2000 |

OTHER PUBLICATIONS

German Examination Report dated Oct. 28, 2003.

* cited by examiner

*Primary Examiner*—Minh N. Tang
(74) *Attorney, Agent, or Firm*—Patterson & Sheridan, L.L.P.

(57) ABSTRACT

Integrated module having a circuit and a plurality of input/output terminals, each of the input/output terminals being connected to a driver circuit for driving output signals and to a reception circuit for receiving input signals, a first delay element with a first delay time being provided in the integrated module, which delay element can be connected into a signal path of a circuit-internal signal or can be disconnected, in order to delay or to accelerate the circuit-internal signal, wherein provision is made of a first test delay element at a first input/output terminal pair which is embodied in a manner structurally identical to the first delay element, in order, in a test operation, to determine the delay time by means of the signal propagation time between the two input/output terminals of the first input/output terminal pair.

17 Claims, 1 Drawing Sheet

INTEGRATED MODULE HAVING A DELAY ELEMENT

CROSS-REFERENCE TO RELATED APPLICATIONS

This application claims foreign priority benefits under 35 U.S.C. §119 to co-pending German patent application number 103 07 537.2-33, filed Feb. 21, 2003. This related patent application is herein incorporated by reference in its entirety.

BACKGROUND OF THE INVENTION

1. Field of the Invention

The invention relates to an integrated module having a delay element for setting a desired delay of a circuit-internal signal. The invention furthermore relates to a method for setting a temporal position of a signal in a signal path of a circuit of an integrated module to a desired signal position.

2. Description of the Related Art

Integrated circuits have signal paths carrying signals with respect to circuits. On account of interconnect lengths, line capacitances and the like, the circuit-internal signals experience a delay which cannot be determined exactly prior to the fabrication of the integrated circuit since, by way of example, the influence of the housing, of the leadframe, and of the process fluctuations cannot be determined exactly beforehand. It is often necessary, therefore, for the circuit-internal signals to be temporally adapted in such a way that their signal edges lie within predetermined time windows. Setup and hold times which prescribe a very precise temporal position of a signal edge exist particularly in the case of memory modules.

For this reason, in the integrated circuit, so-called delay chains are implemented in the signal path, which delay chains can be switched on or switched off in the signal path. By switching on the delay elements, it is possible to delay signals and, by switching off or bridging the delay elements, it is possible to accelerate the signals in the case where a delay element has previously been switched on. The switching-on and -off of the delay elements is carried out with the aid of an additional metalization mask in the fabrication process for the integrated circuit, the metalizations performed for switching a delay element into a signal path or, by means of a short-circuiting when bridging a delay element, not switching a delay element into the signal path.

The adaptation of the signal propagation time is carried out with the aid of a mask for all the integrated circuits of a processed substrate wafer. A subsequent change after the fabrication of the setting metalization is not possible in the case of processed components. By fabricating a new metal mask, it is possible to adapt subsequent fabricated integrated modules in accordance with altered timing conditions. An individual setting of the signal propagation time in an integrated module is not possible. Moreover, by virtue of the defined switching-on or -off of the delay elements in the signal path, it is no longer possible to take account of differences in the delay times of the delay elements brought about for example by process deviations or the like.

SUMMARY OF THE INVENTION

Therefore, it is an object of the present invention to provide an integrated module in which the delay of a signal on a signal path can be set as precisely as possible. It is furthermore an object of the present invention to provide a method for setting a temporal position of a signal in a signal path of a circuit to a desired signal position.

A first aspect of the present invention provides an integrated module having a circuit and a plurality of input/output terminals. Each of the input/output terminals is connected to a driver circuit for driving output signals and to a reception circuit for receiving input signals. A first delay element is provided in the integrated module, which delay element can be switched on in a signal path of a circuit-internal signal or can be disconnected, in order to delay or to accelerate, i.e. not to delay, the circuit-internal signal. Furthermore, provision is made of a first test delay element at a first input/output terminal pair which is embodied in a manner substantially structurally identical to the first delay element, in order, in a test operation, to determine the first delay time by means of the signal propagation time between the two input/output terminals of the first input/output terminal pair.

What is essential to the integrated module according to one embodiment of the invention is the provision of a first test delay element embodied in a manner substantially structurally identical to the first delay element which can be switched on and off in a signal path. By virtue of the fact that both the first delay element and the first test delay element have been fabricated by the same fabrication processes, the delay times of the two delay elements are essentially identical. The test delay element then enables the exact delay time of the first delay element to be determined in order thus to be able to make a decision as to whether or not the first delay element is to be switched into the signal path.

A second circuit-internal delay element may furthermore be provided, it being possible for the first and second delay elements to be switched independently of one another in the signal path, in order to delay or to accelerate, or not to delay, a circuit-internal signal by connection or disconnection or bridging of the first and/or of the second delay element. Provision is made of a second test delay element at a second input/output terminal pair, the second test delay element being embodied in a manner structurally identical to the second delay element in order, in the test operation, to determine the second delay time by means of the signal propagation time between the two input/output terminals of the second input/output terminal pair. In this way different delay elements can be measured at different input/output terminal pairs, so that a desired delay or acceleration of the circuit-internal signal can be achieved by suitable switching-on/off of the first and/or the second delay element.

A delay control unit may be provided, which is connected to the first and/or the second delay element, in order to delay the circuit-internal signal by connection or disconnection of the first and/or the second delay elements with a desired delay time. The delay control unit preferably has a non-volatile setting memory, in order to store a setting value which determines the connection and the disconnection of the delay elements. In this way, the exact delay of the circuit-internal signal can be set by means of the delay control unit. The non-volatile setting memory enables the delay set to be permanently stored. Consideration is given to fuse memories, in particular electrical fuses as possible setting memories.

Preferably, the input/output terminals of the first and/or the second input/output terminal pair are arranged adjacent to one another. In this way, the signal propagation times on account of line lengths from and to the respective delay element are reduced as far as possible. The first and/or the second test delay element can be switched on and off in accordance with a test control unit, in order to connect the first and/or the second test delay element to the respective input/output terminal pair only during the test operation. In this way, the input/output terminals can be operated separately from one another if the integrated module is not being tested in a test mode.

It may furthermore be provided that input/output terminals of a third input/output terminal pair are connected to one another essentially such that they can be switched on/off in accordance with the test control unit. In this way, it is possible to measure the signal propagation time from one input/output terminal of the third input/output terminal pair to the other input/output terminal. The difference between the measured signal propagation time through a test delay element and the signal propagation time through the third input/output terminal pair then corresponds to the delay time of the measured test delay element, it being possible to work out the signal propagation times of the feed lines to the test delay element.

It may be provided that the driver circuit and the reception circuit of each of the input/output terminals can be switched on/off separately from one another in accordance with the test operation.

A further aspect of the present invention provides a method for setting a temporal position of a signal in a signal path of a circuit of an integrated module to a desired signal position. A first delay element is switched on or off in the signal path in order to alter the temporal position of the signal in the direction of the desired signal position. A delay time of a first test delay element is measured, which test delay element is embodied in a manner substantially structurally identical to the first delay element and is arranged at an input/output terminal pair, the first delay element being switched on or off depending on the measured delay time.

In this way, before the setting of the signal delay in the signal path, firstly the precise value of the delay time of the delay element is determined before a decision is made as to whether or not the circuit-internal signal is to be delayed by means of the respective delay element.

It may furthermore be provided that a second delay element in the signal path is switched on or off in such a way as to alter the temporal position of the signal in the direction of the desired signal position. The delay time of the second delay element is determined in the same way as that of the first delay element by measuring the delay time of a structurally identical second test delay element arranged at an input/output terminal pair. The respective first and the second delay element is switched on or off depending on the measured delay times of the test delay elements. In this way, the exactly determined delay times of the delay elements can be used to perform an optimization of the switching-on or -off of the individual delay elements, so that the temporal position of the circuit-internal signal is approximated as closely as possible to the desired signal position.

BRIEF DESCRIPTION OF THE DRAWINGS

A preferred embodiment of the invention is explained in more detail in conjunction with the accompanying drawings, in which.

DETAILED DESCRIPTION OF THE PREFERRED EMBODIMENT

Figure 1:
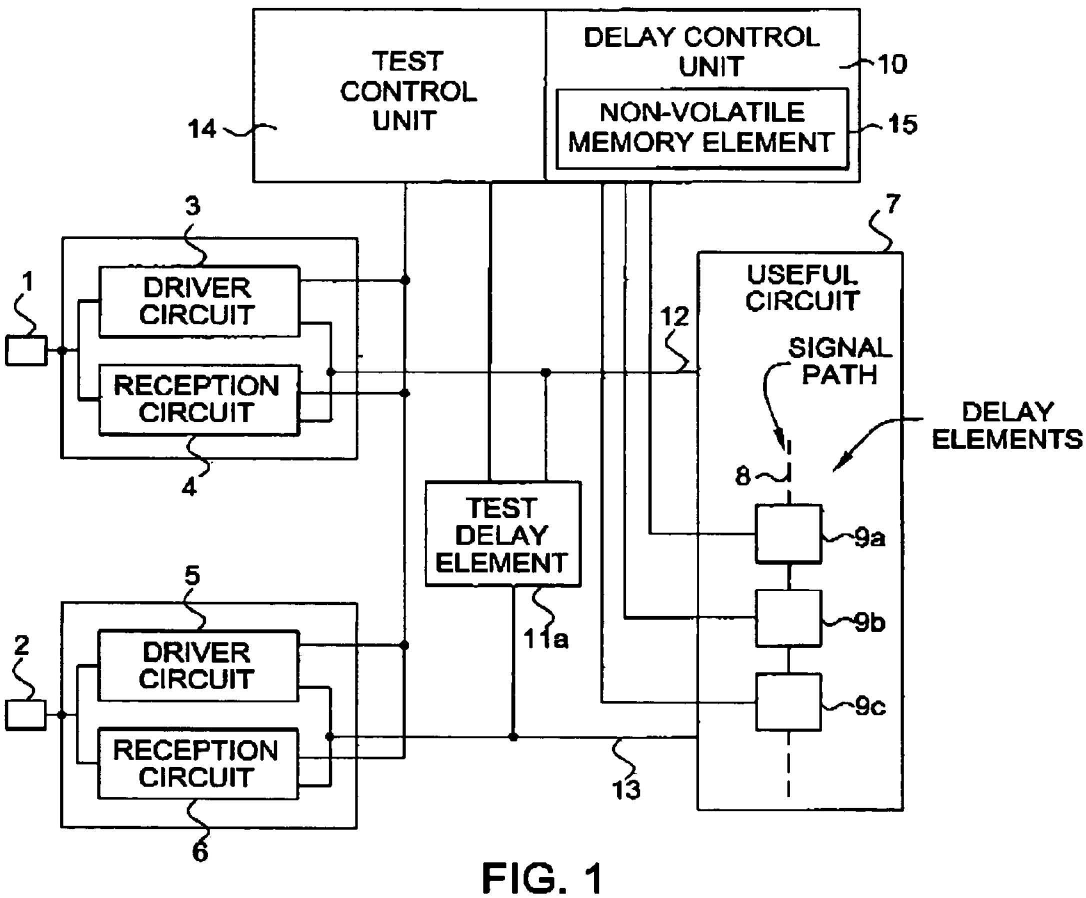
FIG. 1 shows a block diagram of a detail from an integrated module in accordance with one embodiment of the invention.

FIG. 1 shows a detail from an integrated circuit having a first input/output terminal 1 and a second input/output terminal 2. The first input/output terminal 1 is connected to a first driver circuit 3 and a first reception circuit 4. The second input/output terminal is connected to a second driver circuit 5 and a second reception circuit 6. Depending on whether, during normal operation, data are transmitted toward the outside from the input/output terminals or data are to be received via the input/output terminals, the respective driver circuit 3, 5 or the respective reception circuit 4, 6 is activated. This enables a useful circuit 7 to receive data via the input/output terminals 1, 2 or to transmit data via the input/output terminals 1, 2.

The useful circuit 7 has a signal path 8, on which a circuit-internal signal is transferred. The circuit-internal signal serves for driving a timing-sensitive circuit, e.g. a memory circuit in which setup and hold times have to be complied with. Delay elements 9*a*, 9*b*, 9*c* are introduced in the signal path, which delay elements, under the control of a delay control unit 10, are either switched into the signal path, so that the circuit-internal signal is delayed, or are bridged in such a way that the circuit-internal signal is not delayed by the respective delay element 9*a*, 9*b*, 9*c*.

The delay elements 9*a*, 9*b*, 9*c* preferably have different delay time values e.g. 100 picoseconds, 300 picoseconds, 500 picoseconds, etc. These are intended to be switched in such a way that the circuit-internal signal is delayed or accelerated by a specific delay time, so that the circuit-specific timing is complied with. By way of example, if a delay time of 400 picoseconds is to be set, then the delay elements with 100 and 300 picoseconds are switched on, i.e. switched into the signal path, and the delay element with 500 picoseconds is switched off, i.e. bridged in such a way that the signal is essentially not delayed therein.

In order to switch on or to switch off (to bridge) the delay elements 9*a*, 9*b*, 9*c* in a suitable manner, it is necessary to know the exact delay of the delay elements 9*a*, 9*b*, 9*c*. For this purpose, it is provided that a test delay element 11*a* is connected between the first data line 12 and the second data line 13 in such a way that a signal applied to the first input/output terminal 1 is conducted through the test delay element 11*a* and can be received via the second input/output terminal 2. The test delay element 11*a* is embodied in a manner structurally identical to the first delay element 9*a*, so that, given a common fabrication process for the entire circuit, it can be assumed that the delay time of the delay element 9*a* and of the test delay element 11*a* is essentially identical.

A test control unit 14 is provided, by means of which the test delay element 11*a* is switched between the input/output terminals 1, 2 only during a test operation. The test control unit 14 is connected via one or a plurality of control lines to the first and second driver circuits 3, 5 and the first and second reception circuits 4, 6, in order to switch them in a test mode in such a way that a signal applied to the first input/output terminal 1 is driven via the first reception circuit 4 to the test delay element 11*a* and is output again by the second driver circuit 5 at the second input/output terminal 2. By means of an external tester unit (not shown), it is then possible to determine the signal delay of the signal between the first and second input/output terminals 1, 2. The signal delay determined then serves for determining whether the delay element 9*a* corresponding to the test delay element 11*a* is to be switched on or bridged.

Figure 2:
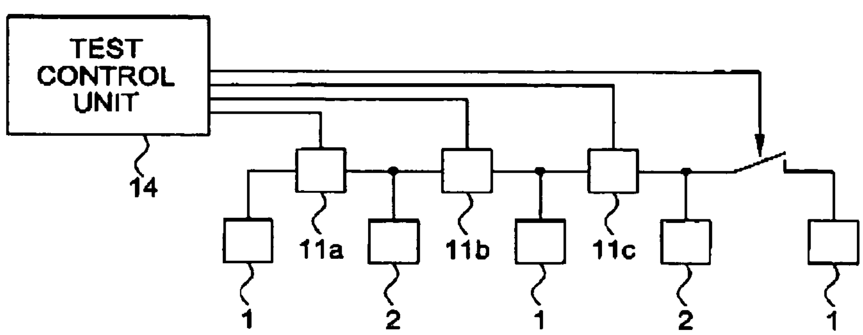
FIG. 2 shows a block diagram of a module according to one embodiment of the invention.

As illustrated in FIG. 2, a plurality of test delay elements 11*a*, 11*b*, 11*c* are arranged between, in each case, two adjacent input/output terminals 1, 2. Each of the test delay elements corresponds to one type of a delay element 9*a*, 9*b*, 9*c* and is embodied correspondingly in a substantially structurally identical fashion. In other words, the first test delay element 11*a* is configured in a manner substantially structurally identical to the first delay element 9*a*, the second test delay element 11*b* is configured in a manner structurally identical to the second delay element 9*b*, the third test delay element 11*c* is configured in a manner structurally identical to the third delay element 9*c*, etc.

When determining the respective delay, as described above, in each case a signal is applied to the first input/output terminal 1 and received via the second input/output terminal 2 and the signal propagation time thereof is determined. In order to eliminate the influence of the feed lines between the first or second input/output terminal 1, 2 and the respective test delay element 11*a*, 11*b*, 11*c*, a switching device is provided between a further input/output terminal pair, which switching device can be activated in accordance with a control signal from the test control unit 14. By application of a signal to the first input/output terminal 1 and measurement of the signal delay to the second input/output terminal 2, it is possible to measure the propagation time on the feed lines. From the difference between the signal propagation time between two input/output terminals with an interposed delay element and without an interposed delay element, it is possible to exactly determine the delay of the respective delay element.

The signal propagation time of the circuit-internal signal on the signal path 8 can then be set as precisely as possible on the basis of the measured delay times of the respective delay elements. In accordance with the circuit-specific specifications, the delay control unit 10 is then informed via an external tester unit (not shown) or is then informed by means of an optimization carried out internally within the circuit, of which of the delay elements are to be switched on, so that the circuit-internal signal is delayed, and which of the delay elements are not switched on, or are bridged, so that the signal passes through the delay element without any delay.

In order that the setting does not have to be carried out anew each time the integrated circuit is switched on, a non-volatile memory element 15 is provided in the delay control unit 10, it being possible to store the setting values for the delay elements 9*a*, 9*b*, 9*c* in said memory element. Said memory element 15 preferably has electrical fuses which can be permanently programmed by means of a programming current, so that setting values are stored. It goes without saying that it is also possible to provide an EPROM or similar non-volatile memory. It is also possible to provide memory elements in direct proximity to the delay elements 9*a*, 9*b*, 9*c* in order to reduce the additional wiring outlay.

An average delay of the circuit-internal signal is preferably set during the fabrication of the integrated circuit, with which delay the timing conditions with regard to setup and hold times, e.g. in the case of DRAM memories or other circuit specifications, can usually be complied with. The circuit described and the associated method then serve for performing a fine adjustment in the integrated modules in which the timing parameters lie outside the predetermined specifications.

The circuit according to the invention enables the possibility that circuits in which the timing specifications are not complied with after complete production do not have to be rejected, by subsequently performing a readjustment of the delay of a circuit-internal signal. This is possible in a particularly precise manner in particular by virtue of test delay elements which are substantially structurally identical with respect to the delay elements being provided, which test delay elements make it possible, for each delay element arranged within the useful circuits 7, to determine the precise delay time by means of an external tester device. This is possible in particular because, in the case of structurally identical delay elements, the same delay times are essentially to be expected on account of the same fabrication process.

While the foregoing is directed to embodiments of the present invention, other and further embodiments of the invention may be devised without departing from the basic scope thereof, and the scope thereof is determined by the claims that follow.

What is claimed is:

1. An integrated module comprising:

a circuit;

a plurality of input/output terminals, each connected to a driver circuit for driving output signals and to a reception circuit for receiving input signals;

a first delay element with a first delay time, wherein the first delay element is capable of being one of:

(i) connected to a signal path of a circuit-internal signal to delay the circuit-internal signal; and (ii) disconnected from the signal path to accelerate the circuit-internal signal;

a first test delay element at a first input/output terminal pair, wherein the first test delay element is constructed in a substantially similar manner to the first delay element; and a test control unit configured to determine in a test operation, the first delay time by means of a signal propagation time between the two input/output terminals of the first input/output terminal pair.

2. The integrated module of claim 1, further comprising:

a second delay element with a second delay time different from the first delay time, wherein the first and second delay elements are separately capable of being a respective one of:

connected into the signal path of the circuit-internal signal to delay the circuit-internal signal; and disconnected from the signal path to accelerate the circuit-internal signal.

3. The integrated module of claim 2, further comprising:

a second test delay element at a second input/output terminal pair, wherein the second test delay element is constructed in a substantially similar manner to the second delay element; and wherein the test control unit is further configured to, in the test operation, determine the second delay time on the basis of the signal propagation time between the two input/output terminals of the second input/output terminal pair.

4. The integrated module of claim 3, further comprising:

a delay control unit coupled with the first and second delay elements to selectively delay and accelerate the signal by selective connection and disconnection of at least one of the first and the second delay elements to the signal path; and a non-volatile setting memory to store a setting value which determines the connection and the disconnection of the first and second delay elements by the delay control unit.

5. The integrated module of claim 3, wherein the two input/output terminals of the first and the second input/output terminal pair are arranged adjacent to one another.

6. The integrated module of claim 3, wherein the first test delay element and the second test delay element are selectively switched on and off in accordance with the test control unit, to connect the first and the second test delay element, selectively, to the respective input/output terminal pair only during the test operation.

7. The integrated module of claim 1 wherein the driver circuit and the reception circuit of each of the input/output terminals are selectively switched on/off in accordance with the test operation.

8. A method for setting a temporal position of a signal in a signal path of a circuit of an integrated module to a desired signal position, comprising:

in a test operation, measuring a first delay time of a first delay element in a signal path of an in-circuit signal by propagating the signal through a first test delay element whose structure is substantially similar to the first delay element; and selectively connecting and disconnecting the first delay element to the signal path based on results of measuring the delay time of the first delay element.

9. The method of claim 8, further comprising:

in a test operation, measuring a second delay time of a second delay element in the signal path of the in-circuit signal by propagating the signal through a second test delay element whose structure is substantially similar to the second delay element; and selectively connecting and disconnecting the second delay element to the signal path based on results of the measuring the delay time of the second delay element.

10. The method of claim 9, wherein the respective switching-on/off of the first delay element and the second delay element is carried out in such a way that a total delay time due to the first and the second delay element is set in accordance with the measured first delay time and the measured second delay time such that the signal position of the signal corresponds to the desired signal position.

11. The method of claim 10, further comprising storing the setting determined with regard to the respective switching-on/off of the first delay element and the second delay element in a non-volatile storage in the integrated module, allowing the temporal position of the signal to be retained.

12. The method of claim 11, wherein storing the selling determined with regard to the respective switching-on/off of the first delay element and the second delay element in the non-volatile storage in the integrated module comprises modifying states of fuses.

13. The method of claim 8, wherein the test operation is performed during a manufacturing process.

14. A dynamic random access memory (DRAM) device, comprising:

one or more memory elements controlled by control signals having associated setup and hold times;

a plurality of input/output terminals, each connected to a driver circuit for driving output signals and to a reception circuit for receiving input signals;

a plurality of delay elements with corresponding delay times, each capable of being one of:

(i) connected into a signal path carrying one of the control signals to delay the one control signal; and (ii) disconnected from the signal path carrying the one control signal to accelerate the one control signal;

a plurality of test delay elements, each arranged between input/output terminals and constructed in a substantially similar manner to one respective delay element; and a test control unit configured to determine, in a test operation, respective delay times of the delay elements based on respective signal propagation times between the input/output terminals of the input/output terminal pairs.

15. The DRAM of claim 14, further comprising a delay control unit to selectively connect and disconnect the delay elements to the signal path based on the delay times determined by the test control unit.

16. The DRAM of claim 15, further comprising a plurality of non-volatile storage elements to store settings indicating, to the delay control unit, which delay elements are connected and disconnected, respectively, to the signal path.

17. The DRAM of claim 16, wherein the non-volatile storage elements are set during a manufacturing process.

* * * * *

UNITED STATES PATENT AND TRADEMARK OFFICE

CERTIFICATE OF CORRECTION

PATENT NO. : 6,975,131 B2 
APPLICATION NO. : 10/783377
DATED : December 13, 2005
INVENTOR(S) : Szczypinski et al.

It is certified that error appears in the above-identified patent and that said Letters Patent is hereby corrected as shown below:

In Claim 1, at Column 6, Line 34, replace “determine in” with --determine, in--.

In Claim 7, at Column 7, Line 10, replace “claim 1 wherein” with --claim 1, wherein--.

In Claim 12, at Column 8, Line 3, replace “selling” with --setting--.

Signed and Sealed this

Fifth Day of June, 2007

JON W. DUDAS
*Director of the United States Patent and Trademark Office*